(12) United States Patent
Chetry et al.

(10) Patent No.: US 12,341,023 B2
(45) Date of Patent: Jun. 24, 2025

(54) SEMICONDUCTOR DEVICE AND METHOD OF MANUFACTURING A SEMICONDUCTOR DEVICE USING MULTIPLE CMP PROCESSES

(71) Applicant: Qorvo US, Inc., Greensboro, NC (US)

(72) Inventors: Krishna Chetry, Richardson, TX (US); Ganesan Radhakrishnan, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 494 days.

(21) Appl. No.: 17/837,934

(22) Filed: Jun. 10, 2022

(65) Prior Publication Data

US 2023/0005756 A1    Jan. 5, 2023

Related U.S. Application Data

(60) Provisional application No. 63/218,290, filed on Jul. 3, 2021.

(51) Int. Cl.
| | | |
|---|---|---|
| *H01L 29/00* | (2006.01) | |
| *H01L 21/02* | (2006.01) | |
| *H01L 21/304* | (2006.01) | |
| *H01L 21/321* | (2006.01) | |

(52) U.S. Cl.
CPC .... *H01L 21/3212* (2013.01); *H01L 21/02013* (2013.01); *H01L 21/02016* (2013.01); *H01L 21/304* (2013.01); *H01L 2221/68372* (2013.01)

(58) Field of Classification Search
CPC .......... H01L 21/3212; H01L 21/02013; H01L 21/02016; H01L 21/304; H01L 2221/68372; H01L 2221/68327; H01L 21/30625; H01L 21/6835; H01L 21/67253; H01L 21/56; H01L 23/3737

USPC .......................................... 257/508; 438/455
See application file for complete search history.

(56) References Cited

U.S. PATENT DOCUMENTS

| | | | |
|---|---|---|---|
| 2020/0094369 A1* | 3/2020 | Chung | B24B 37/042 |
| 2020/0098666 A1* | 3/2020 | Wan | H01L 23/367 |
| 2021/0249503 A1* | 8/2021 | Schmidt | H01L 28/10 |

FOREIGN PATENT DOCUMENTS

| | | | | |
|---|---|---|---|---|
| CN | 1295762 C | * | 1/2007 | B24D 13/14 |
| DE | 102019121994 A1 | | 3/2020 | |
| DE | 102021105366 A1 | | 12/2021 | |
| KR | 102021077679 A | | 6/2021 | |

OTHER PUBLICATIONS

Examination Notice for German Patent Application No. 102022206411. 9, mailed Feb. 2, 2023, 20 pages.

* cited by examiner

*Primary Examiner* — Theresa T Doan
(74) *Attorney, Agent, or Firm* — Withrow & Terranova, P.L.L.C.

(57) ABSTRACT

A method of manufacturing a semiconductor device includes performing one or more grinding processes on a backside surface of a device wafer to thin the device wafer from a first thickness to a second thickness. A first chemical mechanical polish (CMP) process is performed on the backside surface of the device wafer to thin the device wafer from the second thickness to a third thickness. A second CMP process is performed on the backside surface of the device wafer to selectively remove device wafer material that is disposed over an active device area of the semiconductor device, where a removal rate of the device wafer material is a function of depth.

17 Claims, 8 Drawing Sheets

SEMICONDUCTOR DEVICE AND METHOD OF MANUFACTURING A SEMICONDUCTOR DEVICE USING MULTIPLE CMP PROCESSES

RELATED APPLICATION

This application claims the benefit of U.S. provisional patent application No. 63/218,290, filed Jul. 3, 2021, the disclosure of which is hereby incorporated herein by reference in its entirety.

FIELD OF THE DISCLOSURE

Embodiments of the disclosure generally relate to semiconductor devices and methods of manufacturing semiconductor devices. More particularly, embodiments of the disclosure relate to semiconductor devices that include silicon substrates and methods of manufacturing semiconductor devices that include silicon substrates using multiple chemical mechanical polishing (CMP) processes.

BACKGROUND

Current semiconductor manufacturing methods use silicon-on-insulator (SOI) substrates, or silicon substrates with an etch stop layer that protects an epitaxial layer (e.g., an active device area). The availability and cost constraints of SOI substrates and etch stop layers, such as silicon germanium etch stop layers, can limit the production volume needed to support the demand for semiconductor devices that use these features. For example, including an etch stop layer in a semiconductor device can increase both the cost and the complexity of manufacturing a semiconductor device.

SUMMARY

The present disclosure relates to method of manufacturing a semiconductor device that includes a two-step chemical mechanical polish (CMP) process to selectively remove device wafer material (e.g., silicon material) disposed over an active device area of the semiconductor device during backside processing of the semiconductor device. The fabrication methods can be used with a variety of semiconductor devices. In a non-limiting nonexclusive example, the semiconductor device is an integrated radio frequency (RF) power switch. The CMP process is tuned so as to preserve the active device area after the backside processing. The present disclosure removes device wafer material overlying the active device area without any special stop thin film layers. The manufacturing method according to the present disclosure eliminates the need for SOI or silicon substrates with etch stop layers while providing the same or better device and product characteristics. In addition to reducing the manufacturing costs, the process techniques according to the present disclosure remove the availability constraints of SOI and silicon substrates that include etch stop layers.

In an aspect, a method of manufacturing a semiconductor device includes performing one or more grinding processes on a backside surface of a device wafer to thin the device wafer from a first thickness to a second thickness. A first CMP process is performed on the backside surface of the device wafer to thin the device wafer from the second thickness to a third thickness. A second CMP process is performed on the backside surface of the device wafer to selectively remove device wafer material that is disposed over an active device area of the semiconductor device, where a removal rate of the device wafer material is a function of depth.

In some embodiments, performing the one or more grinding processes includes performing a first grinding process and a second grinding process. The first grinding process is a rough or coarse grinding process, and the second grinding process is a fine grinding process. One or more first grinding parameters can be determined and/or adjusted before and/or during the first grinding process. Similarly, one or more second grinding parameters may be determined and/or adjusted before and/or during the second grinding process. Example first grinding parameters and second grinding parameters include, but are not limited to, a revolutions per minute (rpm) of a spindle of a grinding tool, a wheel type used in the grinding tool, an rpm of a stage of the grinding tool, and a tilt of the stage of the grinding tool (e.g., a table inclination).

In certain embodiments, one or more CMP parameters are determined and/or adjusted at select times before and/or during the performance of the first CMP process. Example CMP parameters include, but are not limited to, a thickness profile of the device wafer, a slurry flow rate, an rpm of a polish head of a polishing tool, an rpm of a platen of the polishing tool, and one or more zonal pressures of the polish head in the polishing tool. The thickness profile may be determined and/or adjusted before and/or during the performance of the CMP process. Additionally or alternatively, one or more of the zonal pressures of the polish head can be adjusted based on (e.g., to correct) the thickness profile.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
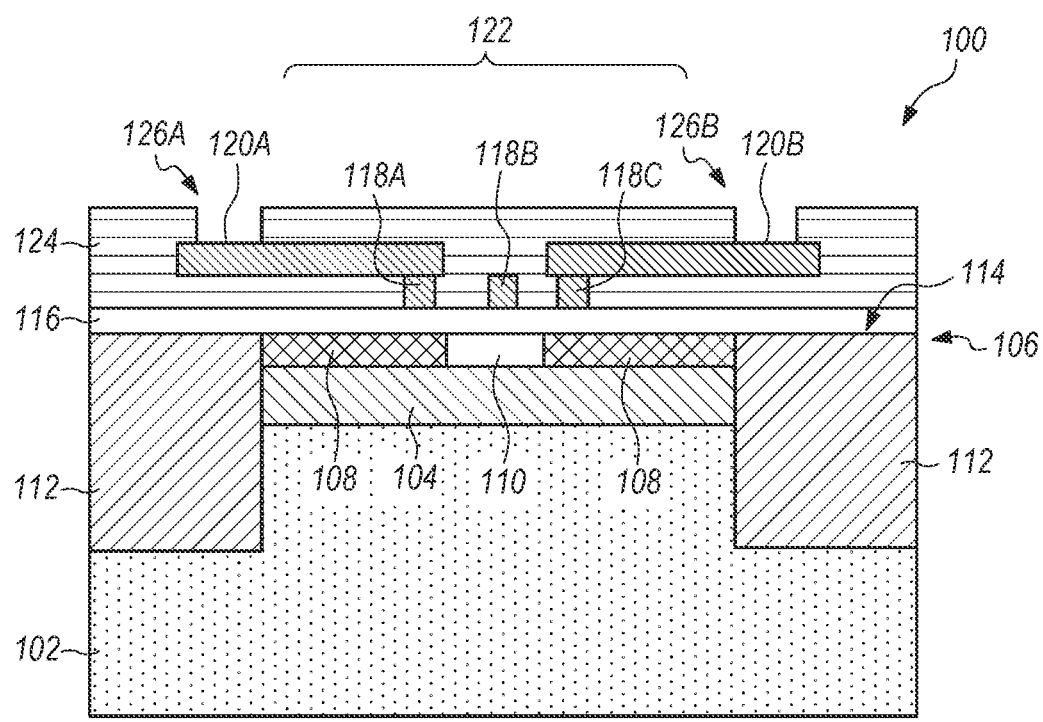
FIG. 1 illustrates an example first semiconductor device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 illustrates an example first semiconductor device 100. The first semiconductor device 100 includes a device wafer 102 with an etch stop layer 104 and an epitaxial layer 106 formed therein. In a non-limiting nonexclusive example, the device wafer 102 is a p-type silicon substrate, the etch stop layer 104 is a silicon-germanium (SiGe) etch stop layer, and the epitaxial layer 106 is a silicon epitaxial layer. Other embodiments are not limited to this implementation.

The epitaxial layer 106 is an active device area of the first semiconductor device 100. The epitaxial layer includes first doped regions 108 and a second doped region 110 disposed between the first doped regions 108. In the illustrated embodiment, the first doped regions 108 are n-type doped source/drain regions and the second doped region 110 is a p-type doped gate region. Isolation regions 112 are formed in the device wafer 102 at a frontside surface 114 of the device wafer 102. In a non-limiting nonexclusive example, the isolation regions 112 are shallow trench isolation (STI) regions of silicon dioxide.

An insulating layer 116 is formed over the isolation regions 112 and the epitaxial layer 106. Formed over the insulating layer 116 are a first conductive contact 118A, a second conductive contact 118B, a third conductive contact 118C, a first conductive line 120A, and a second conductive line 120B. The first conductive contact 118A and the third conductive contact 118C operably contact (e.g., electrically contact) the first doped regions 108, and the second conductive contact 118B operably contacts the second doped region 110. The first conductive line 120A operably contacts the first conductive contact 118A, and the second conductive line 120B operably contacts the third conductive contact 118C. The first conductive contact 118A, the second conductive contact 118B, the third conductive contact 118C, the first conductive line 120A, and the second conductive line 120B are made of any suitable conductive material, such as metal or polysilicon. In the illustrated embodiment, the first conductive contact 118A, the second conductive contact 118B, the third conductive contact 118C, the first doped regions 108, and the second doped region 110 collectively form a transistor 122, and the first conductive line 120A and the second conductive line 120B are signal lines that operably connect to the transistor 122.

The first conductive contact 118A, the second conductive contact 118B, the third conductive contact 118C, the first conductive line 120A, and the second conductive line 120B are disposed in a dielectric layer 124 to electrically isolate the first conductive contact 118A, the second conductive contact 118B, the third conductive contact 118C, the first conductive line 120A, and the second conductive line 120B from each other. A first opening 126A is formed in the dielectric layer 124 to expose a portion of the first conductive line 120A. A second opening 126B is formed in the dielectric layer 124 to expose a portion of the second conductive line 120B. The first opening 126A and the second opening 126B enable electrical connections to be made to the exposed portions of the first conductive line 120A and the second conductive line 120B, respectively.

Generally, the first conductive contact 118A, the second conductive contact 118B, and the third conductive contact 118C are formed by patterning a first conductive layer that is formed over the insulating layer 116. The first conductive line 120A and the second conductive line 120B are formed by patterning a second conductive layer. Although FIG. 1 depicts two conductive layers, other embodiments are not limited to this implementation. A semiconductor device may include more than two conductive layers, where each conductive layer is surrounded by a dielectric layer. Thus, the conductive layers and the dielectric layers form an intermetal dielectric (IMD) structure.

As part of the manufacturing process for the first semiconductor device 100, the device wafer 102 is thinned using a grinding process. The device wafer 102 is thinned to a thickness that enables a subsequently performed plasma dry etch or a selective wet etch to remove the remaining device wafer 102 and stop on the etch stop layer 104. Another dry etch process is then performed to remove the etch stop layer 104 and stop on the epitaxial layer 106. The etch stop layer 104, the plasma dry etch and/or the selective wet etch can increase the cost and/or the complexity of manufacturing the first semiconductor device 100. Embodiments of the present disclosure provide manufacturing techniques that enable the etch stop layer 104 and the plasma dry etch and/or the selective wet etch to be omitted from the manufacturing process. The manufacturing techniques include the performance of two CMP processes, where the first CMP process removes bulk device wafer material (e.g., bulk silicon) and the second CMP process selectively removes bulk device wafer material that is disposed over an active device area.

Figure 2:
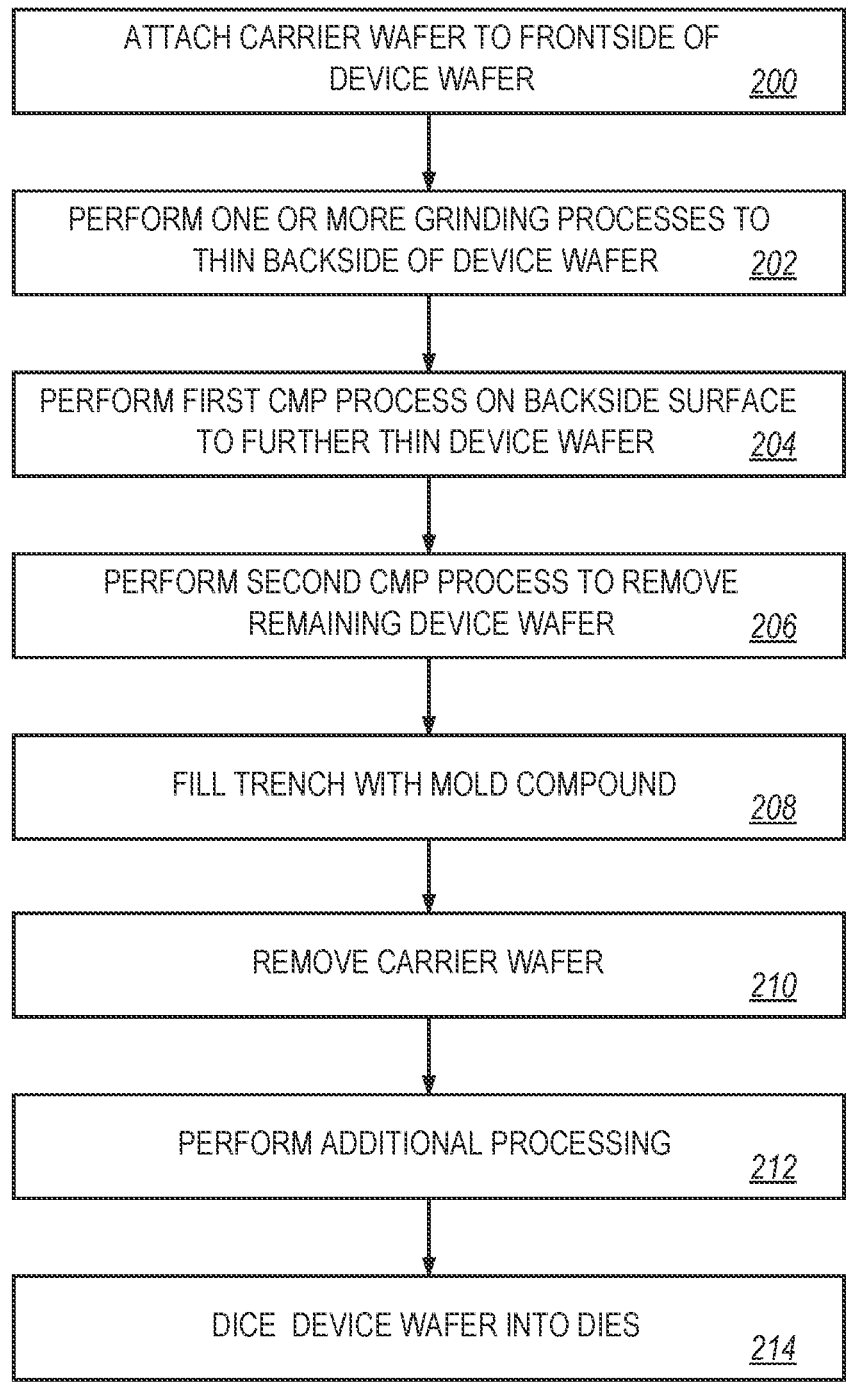
FIG. 2 illustrates an example method of manufacturing a second semiconductor device in accordance with embodiments of the disclosure.

FIG. 2 illustrates an example method of manufacturing a second semiconductor device in accordance with embodiments of the disclosure. The method is described in conjunction with FIGS. 3-10. Initially, as shown in block 200, a carrier wafer is attached to a frontside surface of a device wafer. In certain embodiments, the device wafer is a p-type silicon wafer that includes one or more active components, one or more passive components, or combinations thereof. For example, the device wafer can include one or more transistors, one or more resistors, and/or one or more capacitors in at least one active device area.

Figure 3:
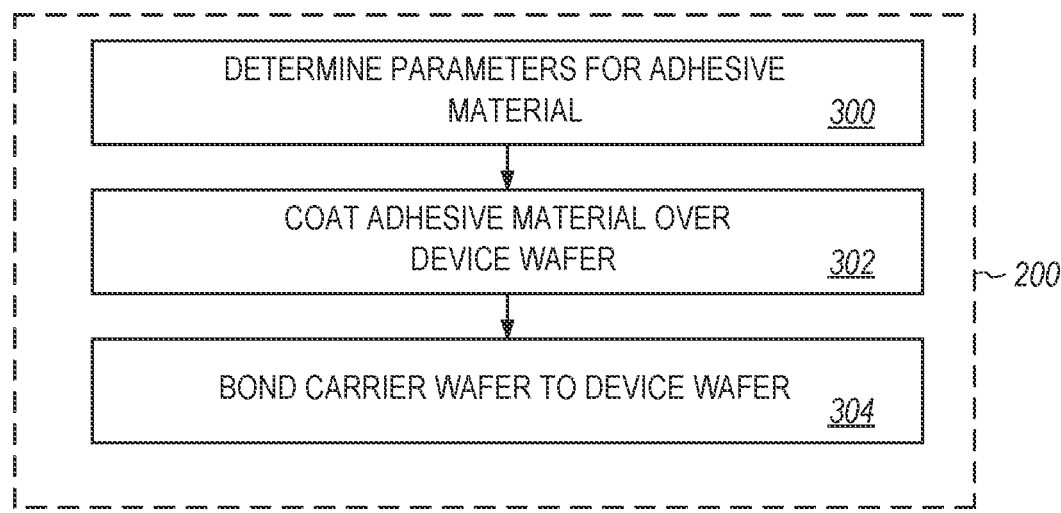
FIG. 3 illustrates an example method of attaching the carrier wafer to the device wafer in accordance with embodiments of the disclosure.

FIG. 3 illustrates an example method of attaching the carrier wafer to the device wafer in accordance with embodiments of the disclosure. In such embodiments, an adhesive that is used to bond the carrier wafer to the device wafer has a substantially uniform thickness over the device wafer. One or more coating parameters for the adhesive material are determined at block 300. The one or more coating parameters may be based on improving or optimizing a thickness uniformity of the adhesive material on the device wafer and/or improving or optimizing a bonding strength that is to be achieved while the carrier wafer is bonded to the device wafer. The determination of the one or more coating parameters can also be based on maintaining the ability to remove or debond the carrier wafer from the device wafer. Example coating parameters include, but are not limited to, a coating thickness of the adhesive material, a spin speed for coating the adhesive material onto the device wafer (or onto the carrier wafer), and a temperature and/or a viscosity of the adhesive material for coating the adhesive material onto the device wafer (or the carrier wafer).

Next, as shown in block 302, the adhesive material is coated over the device wafer (or the carrier wafer). The adhesive material can have a substantial uniform thickness across the device wafer. In certain embodiments, the adhesive material is coated over the frontside surface of the device wafer (or the backside surface of the carrier wafer). In certain embodiments, the device wafer is circular in shape, so the thickness is substantially uniform across a diameter of the device wafer. In a non-limiting nonexclusive example, the thickness is approximately thirty (30) micrometers, and the adhesive material has a coating thickness uniformity of approximately seven-tenths (0.7) micrometers total thickness variation (TTV). In other embodiments, the adhesive material can have a different thickness and/or TTV.

After the adhesive material is coated over a surface of the device wafer (or the carrier wafer) at block 302, the carrier wafer and the device wafer are bonded to each other (block 304). In some embodiments, an air pressurized bonding chamber is used to produce a high-pressure uniformity of the adhesive material across the device wafer, and a TAZMO thermal bonding tool is used to bond the carrier wafer and the device wafer. In a non-limiting nonexclusive example, a total pressure of twelve thousand (12,000) Newtons (N) was used at two hundred degrees Celsius to bond the carrier wafer and the device wafer.

Figure 4:
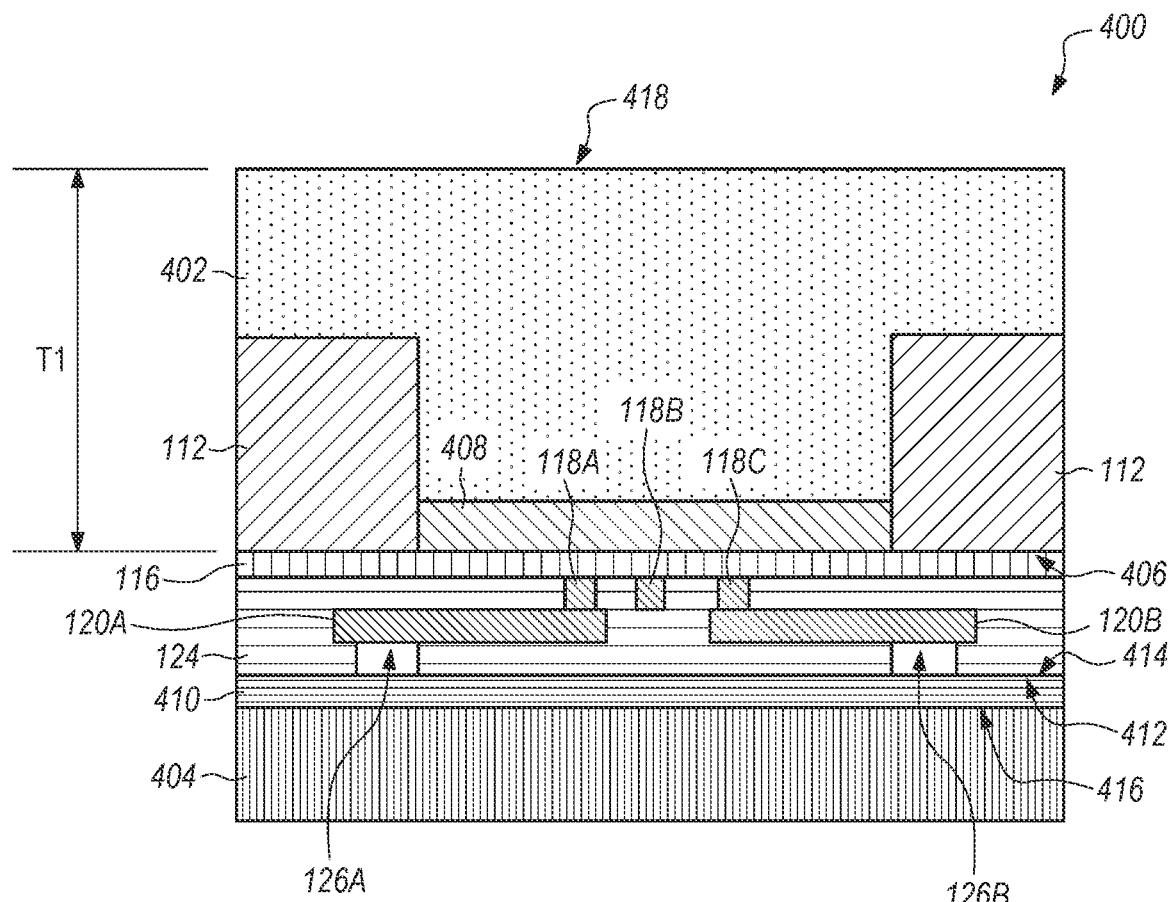
FIG. 4 illustrates an example second semiconductor device that includes a device wafer and a carrier wafer in accordance with embodiments of the disclosure.

FIG. 4 illustrates an example second semiconductor device 400 that includes a device wafer 402 and a carrier wafer 404 in accordance with embodiments of the disclosure. The carrier wafer 404 is bonded to a frontside surface 406 of the device wafer 402. In a non-limiting nonexclusive example, the device wafer 402 is a silicon wafer. A doped region 408 is formed in the device wafer 402 at the frontside surface 406 of the device wafer 402. One or more active components, one or more passive components, or combinations thereof can be fabricated in the doped region 408. For example, the doped region 408 can include source/drain regions for one or more transistors. Thus, the doped region 408 is an active device area of the second semiconductor device 400.

The example device wafer 402 further includes the isolation regions 112 formed at the frontside surface 406 of the device wafer 402 and adjacent to the side or vertical edges of the doped region 408. The doped region 408 is disposed between the isolation regions 112. The insulating layer 116 is formed over the frontside surface 406 of the device wafer 402 (e.g., over the isolation regions 112 and the doped region 408). Formed over the insulating layer 116 are the example first conductive contact 118A, the second conductive contact 118B, the third conductive contact 118C, the first conductive line 120A, and the second conductive line 120B. The first conductive contact 118A, the second conductive contact 118B, the third conductive contact 118C, the first conductive line 120A, and the second conductive line 120B are disposed in the dielectric layer 124. The first opening 126A and the second opening 126B are formed in the dielectric layer 124.

An adhesive layer 410 is used to bond the carrier wafer 404 to the device wafer 402. FIG. 4 shows the second semiconductor device 400 flipped over onto the adhesive layer 410 such that a frontside surface 412 of the second semiconductor device 400 is attached to a backside surface 414 of the adhesive layer 410. The carrier wafer 404 is attached to a frontside surface 416 of the adhesive layer 410. Any suitable carrier wafer 404 and adhesive layer 410 can be used. In non-limiting nonexclusive examples, the carrier wafer 404 is made of glass, quartz, or silicon and the adhesive layer 410 is a polymer-based adhesive layer. The adhesive layer 410 may be deposited over the frontside surface 412 of the second semiconductor device 400, or the adhesive layer 410 can be a laminate film that is laminated over the frontside surface 412 of the second semiconductor device 400.

Figure 7:
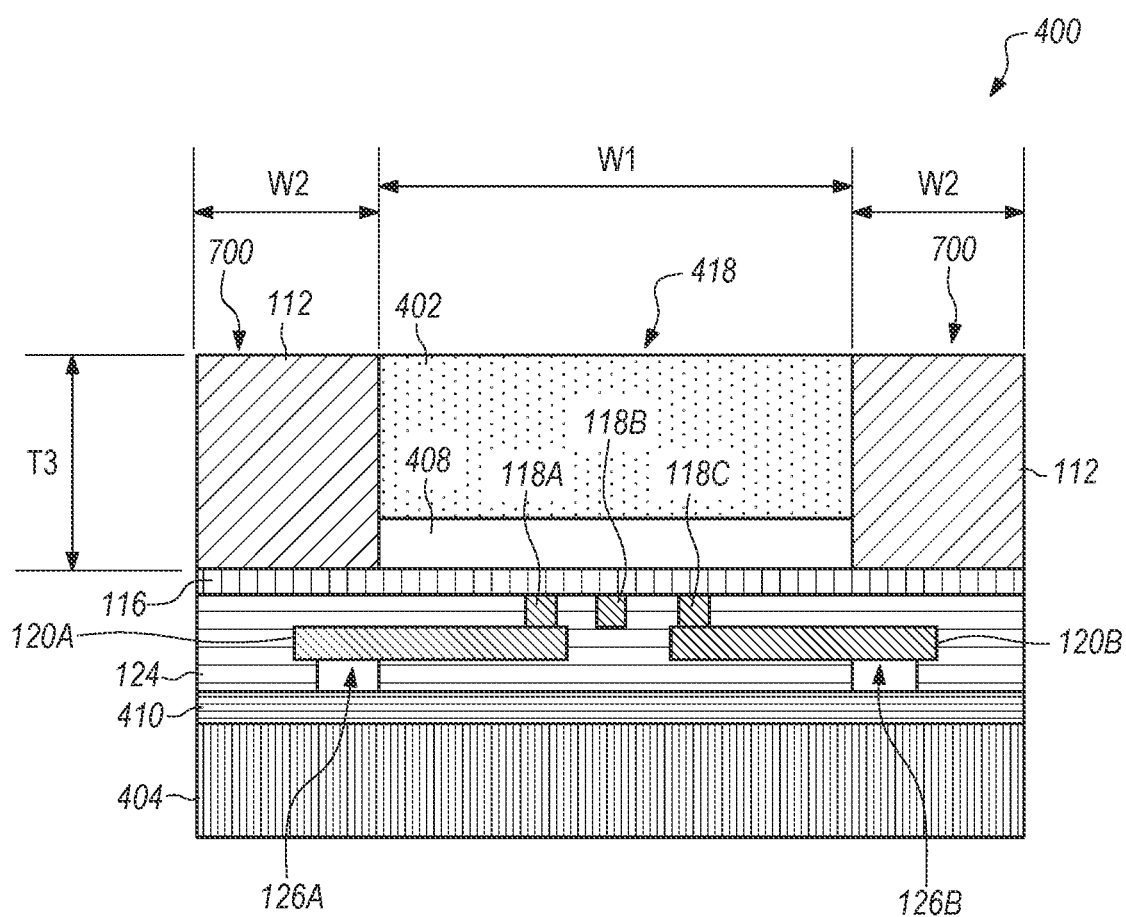
FIG. 7 illustrates the second semiconductor device shown in FIG. 6 after the device wafer is further thinned in accordance with embodiments of the disclosure.
Figure 8:
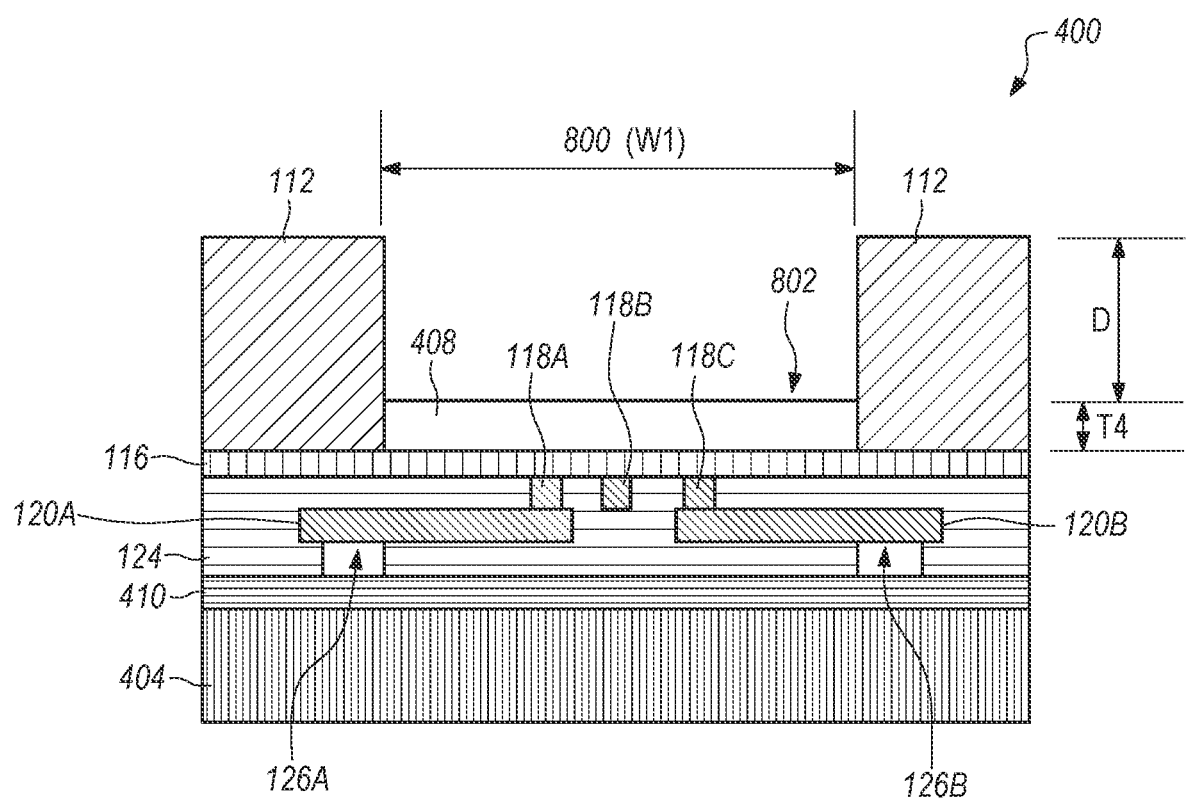
FIG. 8 illustrates the second semiconductor device shown in FIG. 7 after a portion of the remaining device wafer is selectively removed in accordance with embodiments of the disclosure.

As will be described in more detail later, multiple processes are performed on a backside surface 418 of the device wafer 402 to thin the device wafer 402 from a first thickness T1 shown in FIG. 4 to a second thickness T2 (FIG. 6), from the second thickness T2 to a third thickness T3 (FIG. 7), and to remove the remaining device wafer material (FIG. 8). The carrier wafer 404 provides support and stability to the second semiconductor device 400 during the multiple processes. In a non-limiting nonexclusive example, T1 is approximately seven hundred and twenty-five (725) micrometers.

Returning to FIG. 2, one or more grinding processes are performed on the backside surface of the device wafer to thin the device wafer (block 202). The device wafer is thinned from the first thickness to the second thickness. In a non-limiting nonexclusive example, the first thickness is approximately seven hundred and twenty-five (725) micrometers, and the second thickness is greater than or substantially equal to five (5) micrometers. The first thickness and/or the second thickness may have different values in other embodiments. For example, the first thickness may be approximately seven hundred (700) micrometers, and/or the second thickness can be substantially equal to, or less than, five (5) micrometers.

Figure 5:
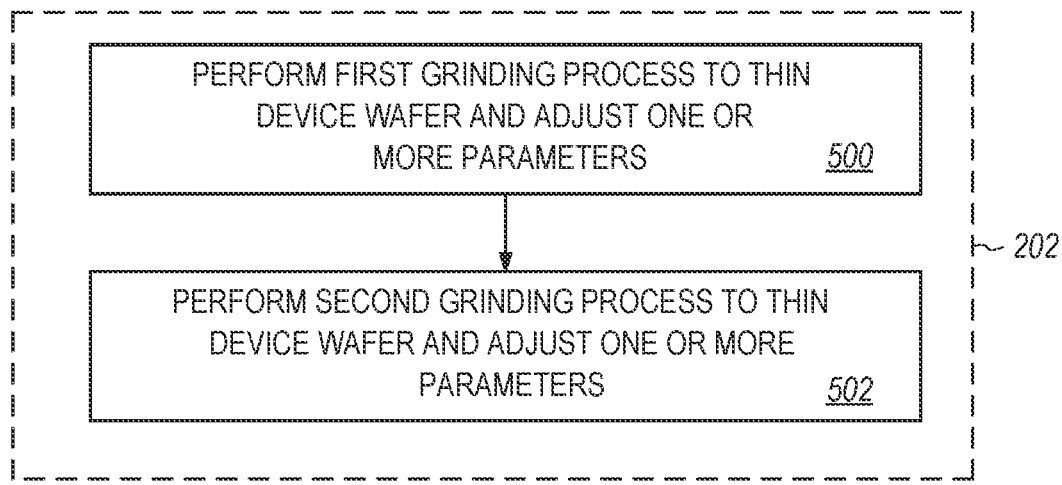
FIG. 5 illustrates an example method of performing a first grinding process and a second grinding process in accordance with embodiments of the disclosure.

In certain embodiments, the one or more grinding processes are performed as a first grinding process and a second grinding process. FIG. 5 illustrates an example method of performing the first grinding process and the second grinding process in accordance with embodiments of the disclosure. The first grinding process is performed to thin the device wafer (block 500). The first grinding process is a rough or coarse grinding process, and one or more first grinding parameters may be determined and/or adjusted before and/or during the performance of the first grinding process. Example first grinding parameters include, but are not limited to, an rpm of a spindle of a grinding tool, a wheel type used in the grinding tool, an rpm of a stage of the grinding tool, and a tilt of the stage of the grinding tool (e.g., a table inclination). The stage tilt can be adjusted or tuned to manipulate the removal rate of the device wafer material radially across the device wafer. In some embodiments, the TTV of the device wafer is monitored and controlled continuously or at select times during the first grinding process. One or more of the first grinding parameters may be adjusted based on the TTV during the first grinding process. For example, the stage tilt can be adjusted during the first grinding process to produce a particular grind uniformity (or a substantially particular grind uniformity). Additionally or alternatively, the rpm of the spindle may be adjusted based on the TTV.

The second grinding process is performed at block 502 to further thin the device wafer. The second grinding process is a fine grinding process. One or more second grinding parameters can be determined and/or adjusted at select times before and/or during the performance of the second grinding process. Like the first grinding parameters, example second grinding parameters include, but are not limited to, the rpm of the spindle of the grinding tool, the wheel type used in the grinding tool, the rpm of the stage of the grinding tool, and the tilt of the stage (e.g., the table inclination). As described earlier, the stage tilt may be adjusted or tuned to manipulate the removal rate of the device wafer material radially across the device wafer. In certain embodiments, the TTV of the device wafer is monitored and controlled continuously or at select times during the performance of the second grinding process. One or more of the second grinding parameters may be adjusted based on the TTV during the second grinding process. For example, the type of wheel that is used in the grinding tool may be changed during the second grinding process to produce a particular grind uniformity (or a substantially particular grind uniformity).

In certain embodiments, the TTV that is used for the first grinding process (a "first TTV") differs from the TTV that is used for the second grinding process (a "second TTV"). In a non-limiting nonexclusive example, the first TTV is one and a half (1.5) micrometers and the second TTV is one (1) micrometer. In other embodiments, the first TTV is the same as the second TTV.

Figure 6:
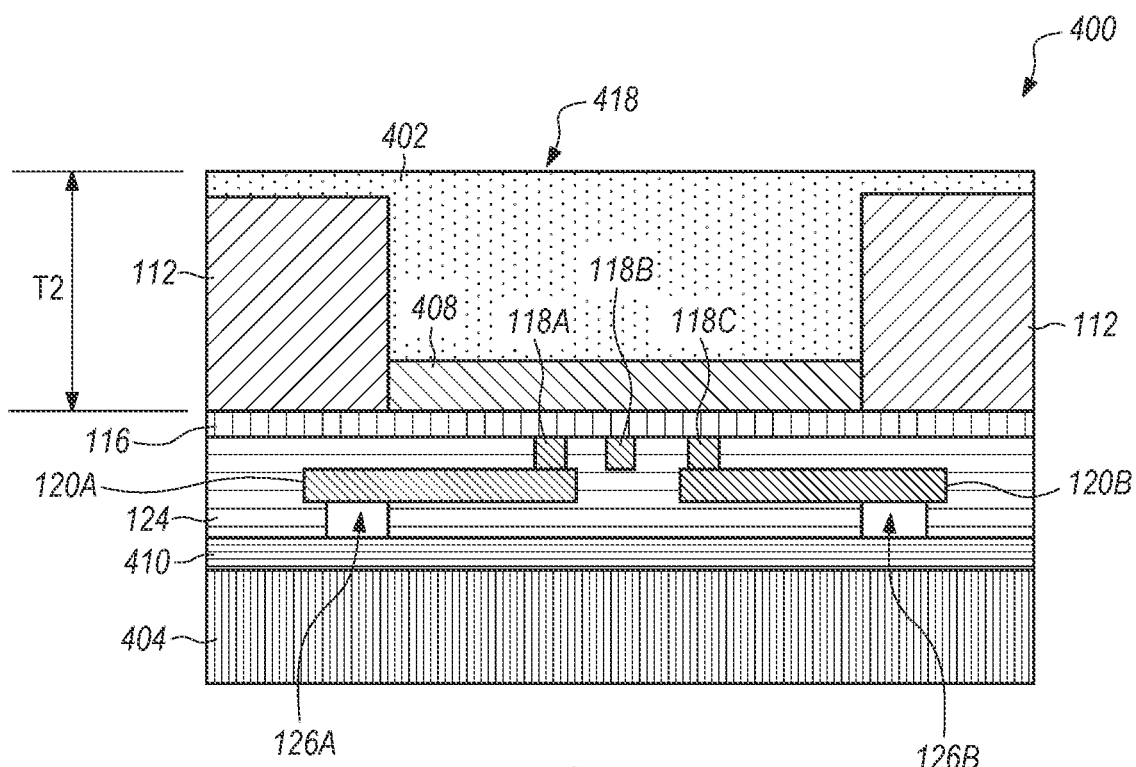
FIG. 6 illustrates the second semiconductor device shown in FIG. 4 after the device wafer is thinned in accordance with embodiments of the disclosure.

FIG. 6 illustrates the second semiconductor device 400 shown in FIG. 4 after the device wafer 402 is thinned in accordance with embodiments of the disclosure. In the illustrated embodiment, the backside surface 418 of the device wafer 402 is thinned. The one or more grinding processes remove approximately seven hundred and twenty (720) micrometers of the device wafer 402. Thus, T2 is approximately equal to five (5) micrometers. In another non-limiting nonexclusive example, T2 may be greater than five (5) micrometers or less than five (5) micrometers.

After the one or more grinding processes are performed at block 202 in FIG. 2, a first CMP process is performed on the backside surface of the device wafer at block 204 to further thin the device wafer. The first CMP process thins the device wafer from the second thickness to a third thickness. In a non-limiting nonexclusive example, the device wafer is a silicon wafer and the first CMP process removes bulk silicon at a polish head pressure of two (2) pounds-per-square inch (psi) using a hard pad and a high selectivity slurry to polish the silicon wafer.

In certain embodiments, one or more CMP parameters may be determined and/or adjusted at select times before and/or during the performance of the first CMP process. Example CMP parameters include, but are not limited to, a thickness profile of the device wafer, a slurry flow rate, an rpm of a polish head of a polishing tool, an rpm of a platen of the polishing tool, and one or more zonal pressures of the polish head in the polishing tool. The thickness profile may be determined and/or adjusted before and/or during the performance of the CMP process. Adjustments of one or more CMP parameters can reduce or eliminate the formation of defects in the thinner region(s) of the post-ground device wafer due to punch-through during polishing. For example, one or more of the zonal pressures of the polish head can be adjusted based on (e.g., to correct) the thickness profile. The first CMP process may continue in this controlled manner until an average thickness at a given point on the device wafer (e.g., the center of the device wafer) reaches the third thickness.

FIG. 7 illustrates the second semiconductor device 400 shown in FIG. 6 after the device wafer 402 is further thinned in accordance with embodiments of the disclosure. The first CMP process removes the device wafer 402 overlying the backside surfaces 700 of the isolation regions 112 such that the material in the device wafer substantially resides between the isolation regions 112. The first CMP process thins the device wafer 402 from the thickness T2 to a thickness T3. In a non-limiting nonexclusive example, T3 is approximately two hundred and fifty (250) nanometers, a width (W1) between the isolation regions 112 is approximately two (2) to ten (10) micrometers, and a width (W2) of each isolation region 112 is approximately two (2) to four (4) micrometers.

Referring again to FIG. 2, a second CMP process is performed on the backside surface of the device wafer at block 206 to remove remaining portions of the device wafer that reside over the doped region and between the isolation regions. The second CMP process forms a trench between the isolation regions that exposes a backside surface of the doped region. The second CMP process is designed to remove the bulk device wafer material (e.g., bulk silicon material) and to prevent or minimize damage to the doped region (e.g., the active device area).

The second CMP process is operable to remove the device wafer material (e.g., the bulk silicon) to a given depth. Thus, the second CMP process is at least controlled based on depth, where a removal rate of the device wafer material (e.g., the silicon material) is a function of the depth. As the depth that the second CMP process is operating at increases, the removal rate of the device wafer material decreases. In a non-limiting nonexclusive example, the device wafer is a silicon wafer and the second CMP process removes bulk silicon and bulk silicon in the trench at one and one tenth (1.1) psi using a soft pad and a high selectivity slurry to polish the silicon wafer.

FIG. 8 illustrates the second semiconductor device 400 shown in FIG. 7 after a portion of the remaining device wafer 402 is selectively removed in accordance with embodiments of the disclosure. The second CMP process removes the device wafer 402 that resides over the doped region 408 and between the isolation regions 112. The second CMP process forms the trench 800 between the isolation regions 112. The trench 800 exposes a backside surface 802 of the doped region 408. The trench 800 has a depth D and the doped region 408 a thickness T4. In a non-limiting nonexclusive example, the width (W1) of the trench 800 is approximately two (2) to ten (10) micrometers, D is approximately one hundred (100) nanometers, and T4 is approximately one hundred and fifty (150) nanometers.

After the second CMP process is performed at block 206 in FIG. 2, the trench is filled with a mold compound (block 208). In one embodiment, the mold compound is made of a material that is not electrically conductive but is thermally conductive. The mold compound can be part of a heat transfer path for the second semiconductor device as the temperature of the second semiconductor device increases during use. Additionally or alternatively, the mold compound may provide mechanical support (e.g., structural support) to the second semiconductor device.

Figure 9:
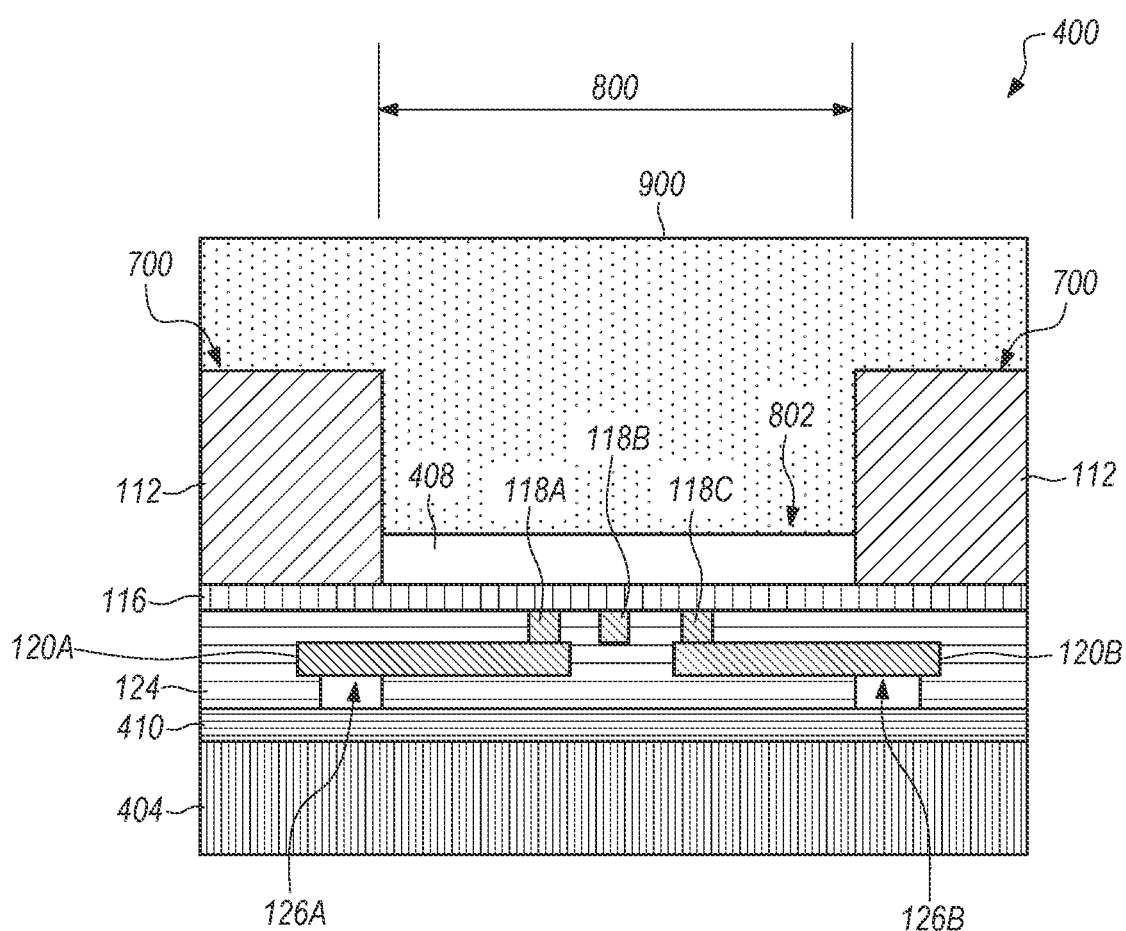
FIG. 9 illustrates the second semiconductor device shown in FIG. 8 after a mold compound is formed in the trench of the second semiconductor device in accordance with embodiments of the disclosure.

FIG. 9 illustrates the second semiconductor device 400 shown in FIG. 8 after a mold compound 900 is formed in the trench 800 of the second semiconductor device 400 in accordance with embodiments of the disclosure. The mold compound 900 fills the trench 800 and is disposed over the backside surfaces 700 of the isolation regions 112. The mold compound 900 extends from the backside surface 802 of the doped region 408 and over the backside surfaces 700 of the isolation regions 112.

Returning to FIG. 2, the carrier wafer is removed from the semiconductor device at block 210. Any suitable method can be used to remove the carrier wafer. In a non-limiting nonexclusive example, the adhesive layer is removed using a laser or a thermal release process. Removal of the adhesive layer also removes the carrier wafer.

One or more additional processes may be performed on the second semiconductor device at block 212. One example of an additional process is to attach a connector to the portion of the first conductive line that is exposed in the first opening, and/or attach a connector to the portion of the second conductive line that is exposed in the second opening. Example conductors include, but are not limited to, solder balls, copper pillars, and wire bonds. Next, as shown in block 214, the device wafer may then be diced to produce individual device dies.

In some embodiments, one or more other processes may be performed before or after an operation shown in FIG. 2 is performed. In a non-limiting nonexclusive example, a passivation layer can be formed over the second semiconductor device after the operation of block 206 is performed and before the operation of block 208 is performed.

Figure 10:
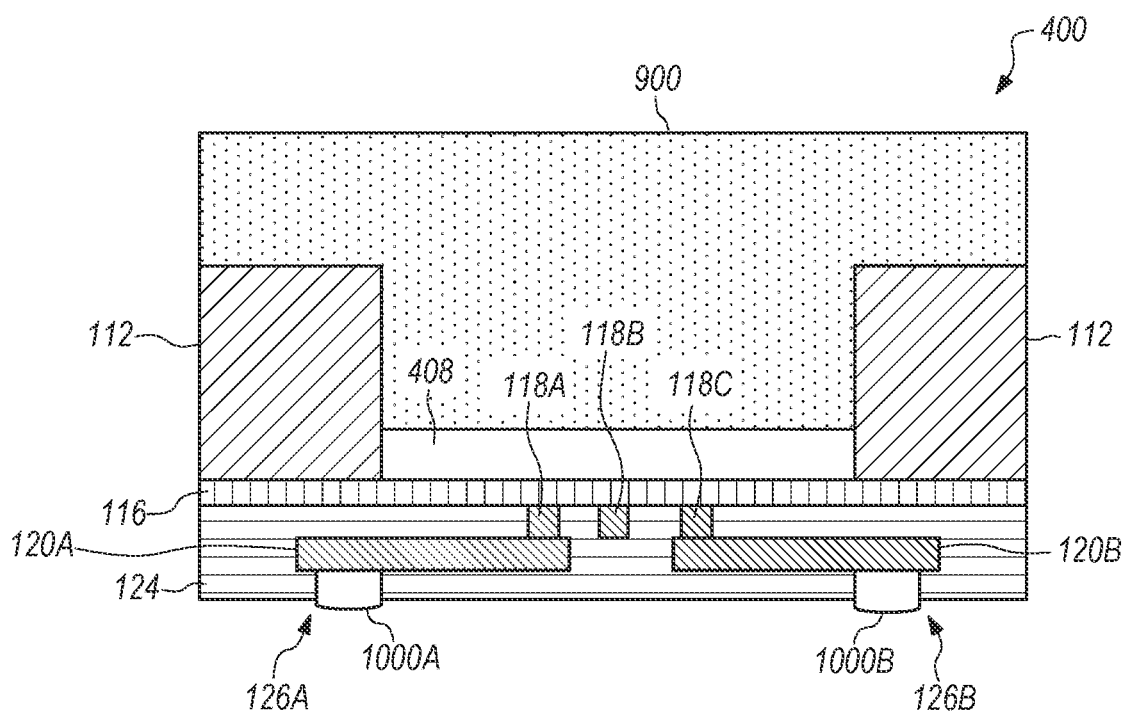
FIG. 10 illustrates the second semiconductor device shown in FIG. 9 after the carrier wafer is removed in accordance with embodiments of the disclosure.

FIG. 10 illustrates the second semiconductor device 400 shown in FIG. 9 after the carrier wafer is removed and conductors 1000A, 10008 contact the first conductive line 120A and the second conductive line 1208 in accordance with embodiments of the disclosure. In certain embodiments, the conductors 1000A, 10008 are used to attach a device die (e.g., one of the individual device dies produced by the dicing process in block 214 of FIG. 2) to another die or to a circuit board, such as a printed circuit board.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. A method of manufacturing a semiconductor device, the method comprising:
 performing one or more grinding processes on a backside surface of a device wafer to thin the device wafer from a first thickness to a second thickness, wherein performing the one or more grinding processes on the backside surface of the device wafer to thin the device wafer from the first thickness to the second thickness comprises performing a first grinding process and a second grinding process;

performing a first chemical mechanical polish (CMP) process on the backside surface of the device wafer to thin the device wafer from the second thickness to a third thickness;

performing a second CMP process on the backside surface of the device wafer to selectively remove device wafer material that is disposed over an active device area of the semiconductor device, wherein a removal rate of the device wafer material is a function of depth; and adjusting at least one first grinding parameter during the performance of the first grinding process based on a first total thickness variation (TTV), the at least one first grinding parameter comprising a revolutions per minute (rpm) of a spindle in a grinding tool or a wheel type used in the grinding tool.

2. The method of claim 1, further comprising bonding a carrier wafer to the device wafer prior to performing the one or more grinding processes.

3. The method of claim 2, wherein the carrier wafer is made of silicon, quartz, or glass.

4. The method of claim 1, wherein the device wafer comprises:
the active device area disposed at a frontside surface of the device wafer;
a first isolation region disposed at the frontside surface of the device wafer and adjacent to a first edge of the active device area; and
a second isolation region disposed at the frontside surface of the device wafer and adjacent to a second edge of the active device area.

5. The method of claim 4, wherein performing the second CMP process on the backside surface of the device wafer to selectively remove bulk device wafer material that is disposed over the active device area of the semiconductor device produces a trench between the first isolation region and the second isolation region and exposes a backside surface of the active device area.

6. The method of claim 5, wherein the trench has a depth of approximately one hundred nanometers.

7. The method of claim 5, further comprising forming a mold compound in the trench.

8. The method of claim 7, wherein the mold compound is thermally conductive and is included in a heat transfer path for the semiconductor device.

9. The method of claim 7, further comprising:
bonding a carrier wafer to the device wafer prior to performing the one or more grinding processes; and
removing the carrier wafer after forming the mold compound in the trench.

10. The method of claim 1, wherein the device wafer is a silicon wafer.

11. The method of claim 1, wherein the first thickness is approximately seven hundred and twenty-five micrometers and the second thickness is approximately five micrometers.

12. The method of claim 1, wherein the third thickness is approximately two hundred and fifty nanometers.

13. The method of claim 1, further comprising adjusting at least one second grinding parameter during the performance of the second grinding process based on a second TTV, the at least one second grinding parameter comprising the rpm of the spindle in the grinding tool, the wheel type used in the grinding tool, an rpm of a stage of the grinding tool, or a tilt of the stage of the grinding tool.

14. The method of claim 1, wherein performing the first CMP process on the backside surface of the device wafer further comprises adjusting at least one CMP parameter based on a thickness profile for the device wafer, the at least one CMP parameter comprising the thickness profile of the device wafer or a slurry flow rate.

15. The method of claim 1, wherein performing the first CMP process on the backside surface of the device wafer further comprises adjusting at least one CMP parameter based on a thickness profile for the device wafer, the at least one CMP parameter comprising a rpm of a polish head of a polishing tool or an rpm of a platen of the polishing tool.

16. The method of claim 1, wherein performing the first CMP process on the backside surface of the device wafer further comprises adjusting at least one CMP parameter based on a thickness profile for the device wafer, the at least one CMP parameter comprising at least one zonal pressure of a polish head of a polishing tool.

17. A method of manufacturing a semiconductor device, the method comprising:
performing one or more grinding processes on a backside surface of a device wafer to thin the device wafer from a first thickness to a second thickness, wherein performing the one or more grinding processes on the backside surface of the device wafer to thin the device wafer from the first thickness to the second thickness comprises performing a first grinding process and a second grinding process;

performing a first chemical mechanical polish (CMP) process on the backside surface of the device wafer to thin the device wafer from the second thickness to a third thickness;

performing a second CMP process on the backside surface of the device wafer to selectively remove device wafer material that is disposed over an active device area of the semiconductor device, wherein a removal rate of the device wafer material is a function of depth; and adjusting at least one first grinding parameter during the performance of the first grinding process based on a first total thickness variation (TTV), the at least one first grinding parameter comprising a revolutions per minute (rpm) of a stage of the grinding tool or a tilt of the stage of the grinding tool.

* * * * *

UNITED STATES PATENT AND TRADEMARK OFFICE
CERTIFICATE OF CORRECTION

PATENT NO. : 12,341,023 B2
APPLICATION NO. : 17/837934
DATED : June 24, 2025
INVENTOR(S) : Krishna Chetry and Ganesan Radhakrishnan It is certified that error appears in the above-identified patent and that said Letters Patent is hereby corrected as shown below:

In the Specification

In Column 4, Line 61, replace "1188" with --118B--.

In Column 4, Line 63, replace "1208" with --120B--.

In Column 4, Line 66, replace "1188" with --118B--.

In Column 5, Line 2, replace "1208" with --120B--.

In Column 5, Line 4, replace "1188" with --118B--.

In Column 5, Line 6, replace "1208" with --120B--.

In Column 5, Line 9, replace "1188" with --118B--.

In Column 5, Line 12, replace "1208" with --120B--.

In Column 5, Line 15, replace "1188" with --118B--.

In Column 5, Line 16, replace "1208" with --120B--.

In Column 5, Line 19, replace "1188" with --118B--.

In Column 5, Line 20, replace "1208" with --120B--.

In Column 5, Line 23, replace "1268" with --126B--.

In Column 5, Line 25, replace "1208" with --120B--.

Signed and Sealed this
Twelfth Day of August, 2025

Coke Morgan Stewart
*Acting Director of the United States Patent and Trademark Office*

CERTIFICATE OF CORRECTION (continued)
U.S. Pat. No. 12,341,023 B2

In Column 5, Line 26, replace "1268" with --126B--.

In Column 5, Line 28, replace "1208" with --120B--.

In Column 5, Line 30, replace "1188" with --118B--.

In Column 5, Line 33, replace "1208" with --120B--.

In Column 7, Line 5, replace "1188" with --118B--.

In Column 7, Line 6, replace "1208" with --120B--.

In Column 7, Line 8, replace "1188" with --118B--.

In Column 7, Line 9, replace "1208" with --120B--.

In Column 7, Line 11, replace "1268" with --126B--.

In Column 10, Line 38, replace "10008" with --1000B--.

In Column 10, Line 39, replace "1208" with --120B--.

In Column 10, Line 41, replace "10008" with --1000B--.